United States Patent

Hinks et al.

[11] Patent Number: 6,046,590
[45] Date of Patent: Apr. 4, 2000

[54] MR IMAGING METHOD WITH TIME DEPENDENCE PROVIDED IN MULTIPLE SPATIAL ENCODING DIRECTIONS

[75] Inventors: Richard S. Hinks, Wexford, Pa.; J. Andrew Derbyshire, Toronto, Canada; Patrick L. LeRoux, Palais Eau, France

[73] Assignee: Sunnybrook Health Science Center, Ontario, Canada

[21] Appl. No.: 09/061,610

[22] Filed: Apr. 16, 1998

[51] Int. Cl.$^7$ ........................................................ G01V 3/00
[52] U.S. Cl. ........................ 324/309; 324/307; 324/303; 324/300; 600/410
[58] Field of Search ...................................... 324/309, 307, 324/303, 300

[56] References Cited

U.S. PATENT DOCUMENTS 5,537,039   7/1996   Le Roux et al. ........................ 324/309

OTHER PUBLICATIONS

W. A. Edelstein, J. M. S. Hutchison, G. Johnson, T. Redpath, Spin warp NMR imaging and applications to human whole–body imaging. Phys. Med. Biol. 25, 751–756 (1980).

J.R. Reichenbach, R. Venkatesan, D.A. Yablonskiy, M.R. Thompson, S. Lai, E.M. Haacke, Theory and application of static field inhomogeneity effects in gradient–echo imaging. J.Magn. Reson. Imaging 7, 266–279 (1997).

C.A. Hamilton, A.D. Elster, J.L. Ulmer, Crisscross MR Imaging: Improved resolution by averaging signals with swapped phase–encoding axes. Radiology 193, 276–279 (1994).

D.G. Kruger, et al. Improved ghost suppression using orthogonal correlation with multicoil data sets, in "Proceedings of the ISMRM, 5th annual meeting, Vancouver, Apr. 1997," p. 1889.

P.L. Le Roux, Y. Sun, Slab boundary artefact reduction in 3DFSE, in "Proceedings of the ISRM, 4th annual meeting, New York, Apr. 1996," p. 112.

Primary Examiner—Christine K. Oda
Assistant Examiner—Brij B. Shrivastav
Attorney, Agent, or Firm—James O. Skarsten; Christian G. Cabou; Phyllis Y. Price

[57] ABSTRACT

A method is provided for acquiring MR image data, which comprises the steps of applying a succession of RF excitation pulses to a selected region of an imaging subject to produce a corresponding succession of MR data signals, generating a readout gradient in association with each of the MR data signals, and acquiring sets of data points from the MR data signals to provide views respectively corresponding thereto. The data points of a view are respectively identified by positions in k-space along a first k-space axis, each of the positions along the first k-space axis having a time offset with respect to a reference. The method further comprises generating a phase encoding gradient in association with each of the MR signals to respectively identify the views by positions in k-space along a second k-space axis orthogonal to the first k-space axis, and providing specified time offsets with respect to the reference for each of the positions along the second k-space axis, each of the specified time offsets being different.

10 Claims, 4 Drawing Sheets

MR IMAGING METHOD WITH TIME DEPENDENCE PROVIDED IN MULTIPLE SPATIAL ENCODING DIRECTIONS

BACKGROUND OF THE INVENTION

The invention disclosed and claimed herein generally pertains to an improved technique for spatially encoding magnetic resonance (MR) image data. More particularly, the invention pertains to a spatial encoding technique wherein time dependence is deliberately introduced in the phase encoding direction, as well as in the readout direction. Even more particularly, the invention pertains to a technique of the above type wherein time dependence is the same in both the phase encoding and readout directions, in order to provide diagonally directed virtual frequency encoding.

As is well known in the MR imaging arts, conventional two-dimensional Fourier Transform (2DFT) MR imaging is characterized by a phase encoding direction and a frequency encoding, or readout direction. More particularly, in conventional MR techniques such as spin warp and spin echo, an RF excitation pulse is applied to a region of interest in an imaging subject, to produce an MR data signal representing structure therein. A phase encoding gradient and a readout gradient are likewise applied to the region of interest, and the data signal is sampled during the readout gradient and a concurrent data acquisition window. If the readout gradient field is directed along the spatial X-axis of the associated MR imaging system, respective data sample points will be located in k-space at different positions $k_x$ along the $k_x$-axis. The data points acquired from the MR signal collectively comprise a view. Thereafter, further sets of RF excitation, phase encoding, and readout gradient pulses are applied to the region of interest to produce successive MR data signals, and to acquire successive views respectively corresponding thereto. Thus, each view is associated with a phase encoding gradient of different amplitude. If the phase encoding gradient is directed along the spatial Y-axis, respective views will be identified in k-space by corresponding positions $k_y$ along the $k_y$-axis.

A conventional spin warp imaging sequence, illustrating the above features, is shown in FIG. 1. Therein, $G_z$ is a slice select gradient, $G_x$ and $G_y$ comprise the readout and phase encoding gradients, respectively, and an MR data signal (not shown) is sampled over the data acquisition window. Generally, if the MR data signal at each location (x, y) in the region of interest is m(x, y), the signal S for an entire 2DFT image reconstruction can be expressed as follows:

$$S = \int_x \int_y m(x, y) e^{-i(k_x x + k_y y)} dx\, dy \qquad \text{Eqn. (1)}$$

It will be readily apparent that a finite, non-zero amount of time is needed to acquire a set of data points from an MR signal during the data acquisition window. In conventional 2DFT MR imaging, time may be defined as $t=t_{TE}+\Delta t_{kx,ky}$, where the term $t_{TE}$ represents the time over which a static phase offset is accrued, due to offset of the gradient recalled echo from the RF excitation pulse (or for a spin echo sequence, from the RF-refocused echo). $\Delta t_{kx,ky}$ represents the time offset from $t_{TE}$ at which each $k_x$, $k_y$ signal is acquired. For the conventional 2DFT imaging method, the k-space time dependence $\Delta t_{kx,ky}$ may be expressed independently for each axis. As is well known, $\Delta t_{kx}$, the time at which data point $k_x$ is acquired as shown in FIG. 1, is $\Delta t_{kx}=k_x/\gamma G_x$. Thus, data acquisition along the $k_x$-axis, i.e., in the readout direction, proceeds as a linear function of time.

Moreover, data acquisition for each successive phase encoding gradient always commences at the same time following the RF signal, i.e., at $t_{TE}$. As a result, $\Delta t_{ky}=0$. Accordingly, the only time dependence in the conventional 2DFT MR imaging is a linear time dependence, along a single axis (e.g., the $k_x$-axis).

It is to be understood that the expression for the MR signal S, as set forth in Equation (1), assumes that all the phase shifts experienced by respective sampled data points result from the spatial encoding process as expressed in the term $e^{-i(k_x x + k_y y)}$. Failure to take into account a condition known as off resonance, commonly due to phenomena such as chemical shift or $B_0$ inhomogeneity, leads to artifacts in MR reconstruction from the acquired data, most notably displacement artifacts in the frequency encoding direction (e.g., the x direction). Accordingly, a more complete form of the signal equation for conventional 2DFT imaging, which captures the effect of off resonance as an additional signal phase term $\Delta\phi=\Delta\omega t$, is as follows:

$$S(t) = \int_x \int_y m(x, y) e^{-i(k_x x + k_y y + \Delta\omega t)} dx\, dy \qquad \text{Eqn. (2)}$$

In Equation (2), S(t) is a complex data point acquired at the time t, $k_x$ and $k_y$ are the time integrals of the gradients $G_x$ and $G_y$, respectively, and $\Delta\omega$ is the angular frequency offset of spins at a given (x, y) location.

The off resonance distortion represented by $\Delta\omega$ results in geometric distortion in an FT reconstructed image. More particularly, as further developed hereinafter, the off resonance distortion causes MR signal information acquired at a location x to be shifted to a position x' in the image, where $x'=x+\Delta\omega/\gamma G_x$. However, because of the time independence of conventional 2DFT imaging in the phase encoding direction, as described above, the image will not be distorted in such direction (e.g., the y direction). In the past, this absence of artifact in the y direction and simple displacement artifact in the x direction due to off resonance was a principal reason for the rapid and widespread adoption of the spin-warp method as the spatial encoding method of choice in MR imaging.

As is well known, swapping the phase and frequency encoding directions is a common practice in MR imaging, to reduce aliasing and also to alter the appearance of motion or flow artifacts. Thus, in accordance with these methods, an initial set of MR data is acquired with the frequency encoding direction oriented, for example, along the X-axis and the phase encoding direction oriented along the Y-axis. Thereafter, a second data set is acquired with the frequency and phase encoding directions swapped. It will be readily apparent that swapping the phase and frequency encoding directions also swaps or changes the direction of off resonance distortion, which necessarily follows the frequency encoding axis. It is also apparent that direct comparison or combination of such images, as for example by averaging or by subtraction will be imperfect in regions affected by off resonance distortion. This has tended to limit the usefulness of such combination or comparison techniques.

SUMMARY OF THE INVENTION

The invention is generally directed to a method of acquiring MR image data, and includes the step of applying a succession of RF excitation pulses to a selected region of an imaging subject, to produce a corresponding succession of MR data signals. The method further comprises generating a readout gradient in association with each of the MR data signals, and acquiring a set of data points from each of the data signals to provide views respectively corresponding thereto. The data points of a given view are respectively identified by positions in k-space along a first k-space axis, each such position having a time offset with respect to a reference (such as the corresponding RF pulse). A phase encoding gradient is likewise generated in association with each MR data signal, to respectively identify the views by positions in k-space along a second k-space axis which is orthogonal to the first k-space axis. Specified time offsets are provided with respect to the reference for each of the positions along the second k-space axis, each of the specified time offsets being different from one other.

In a preferred embodiment of the invention, each of the positions along the second k-space axis has the same time offset, with respect to the reference, as a corresponding position along the first k-space axis. Preferably, if the ith positions along the first and second k-space axes are referred to as $k_{iro}$ and $k_{ipe}$, respectively, and if the readout gradient has an amplitude $G_{ro}$, each first k-space axis position $k_{iro}$ has a time offset given by $k_{ipro}/\gamma G_{ro}$, and each second k-space axis position $k_{ipe}$ has a time offset given by $k_{ipe}/\gamma G_{ro}$. $\gamma$ is gyromagnetic ratio of the Larmor equation.

In a useful embodiment of the invention, respective data points for a given MR data signal are acquired during a data acquisition window corresponding thereto, which commences at a selected time. The readout gradient associated with the given MR signal coincides with the data acquisition window corresponding to the given signal, and likewise commences at the given time. The above step of providing specified time offsets for respective second k-space axis positions comprises selectively varying the commencement times of both the data acquisition windows, and of the readout gradients respectively coinciding therewith.

OBJECTS OF THE INVENTION

An object of the invention is to provide an improved method of 2DFT MR image acquisition, wherein a time dependence is provided in the phase encoding direction as well as in the readout direction.

Another object is to provide a method of the above type which has the same sensitivity to off resonance effects in the phase encoding direction as it has in the readout direction.

Another object is to provide a method of the above type wherein off resonance causes the same degree of spatial shift in both the phase encoding and readout directions.

Another object is to provide a method of the above type which removes time-asymmetry in acquired k-space data.

Another object is to provide a method of the above type, wherein k- space data has a linear time dependence in a diagonal direction, with respect to the readout and phase encoding directions.

Another object is to make more effective use of certain previously described averaging or artifact correction techniques, wherein the phase and frequency encoding directions are swapped in the course of the MR imaging procedure.

These and other objects of the invention will become more readily apparent from the ensuing specification, taken together with the accompanying drawings.

DETAILED DESCRIPTION OF THE PREFERRED EMBODIMENT

Figure 1:
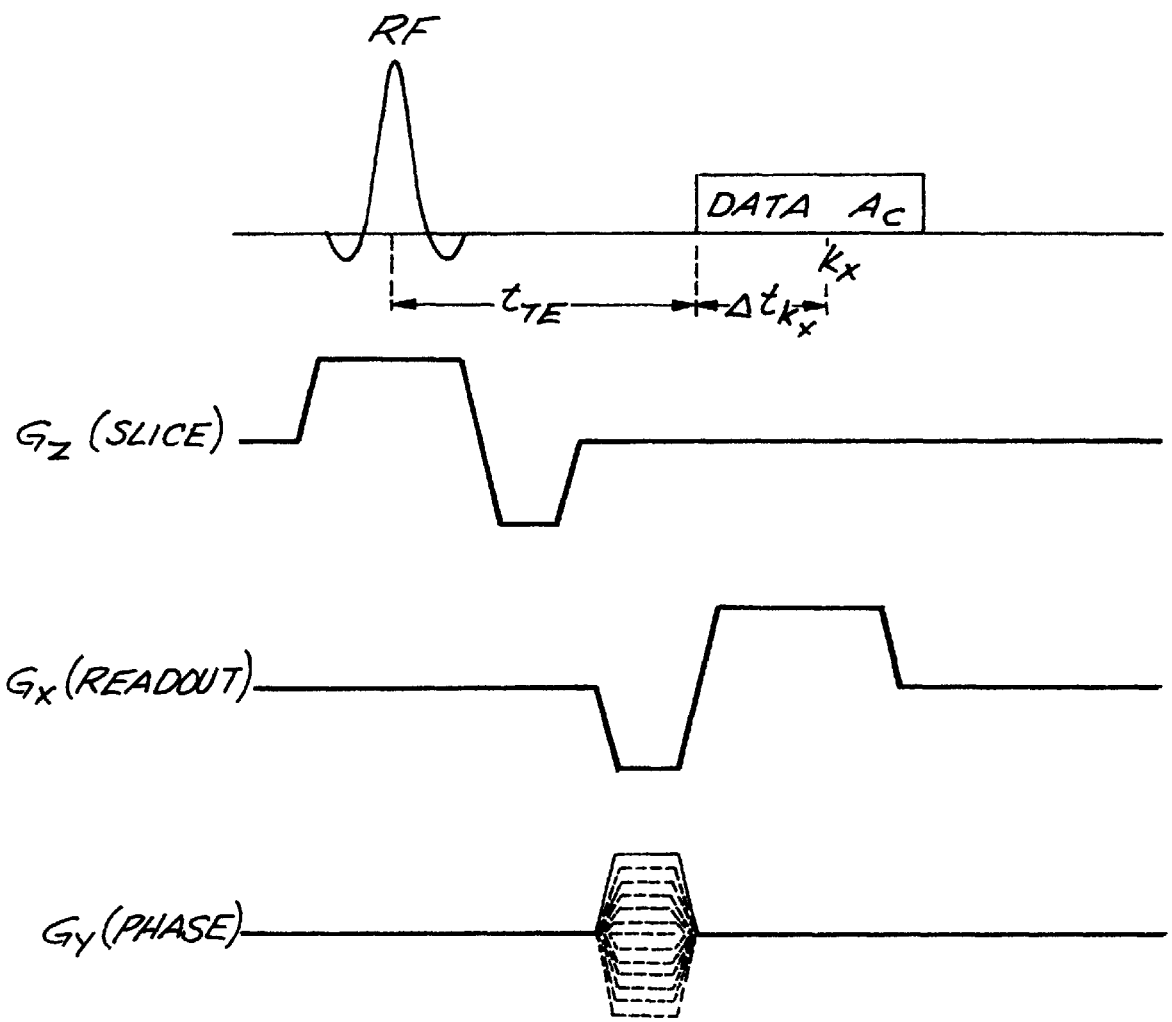
FIG. 1 is a pulse sequence diagram showing conventional 2D Fourier encoding by means of the spin warp method.
Figure 2:
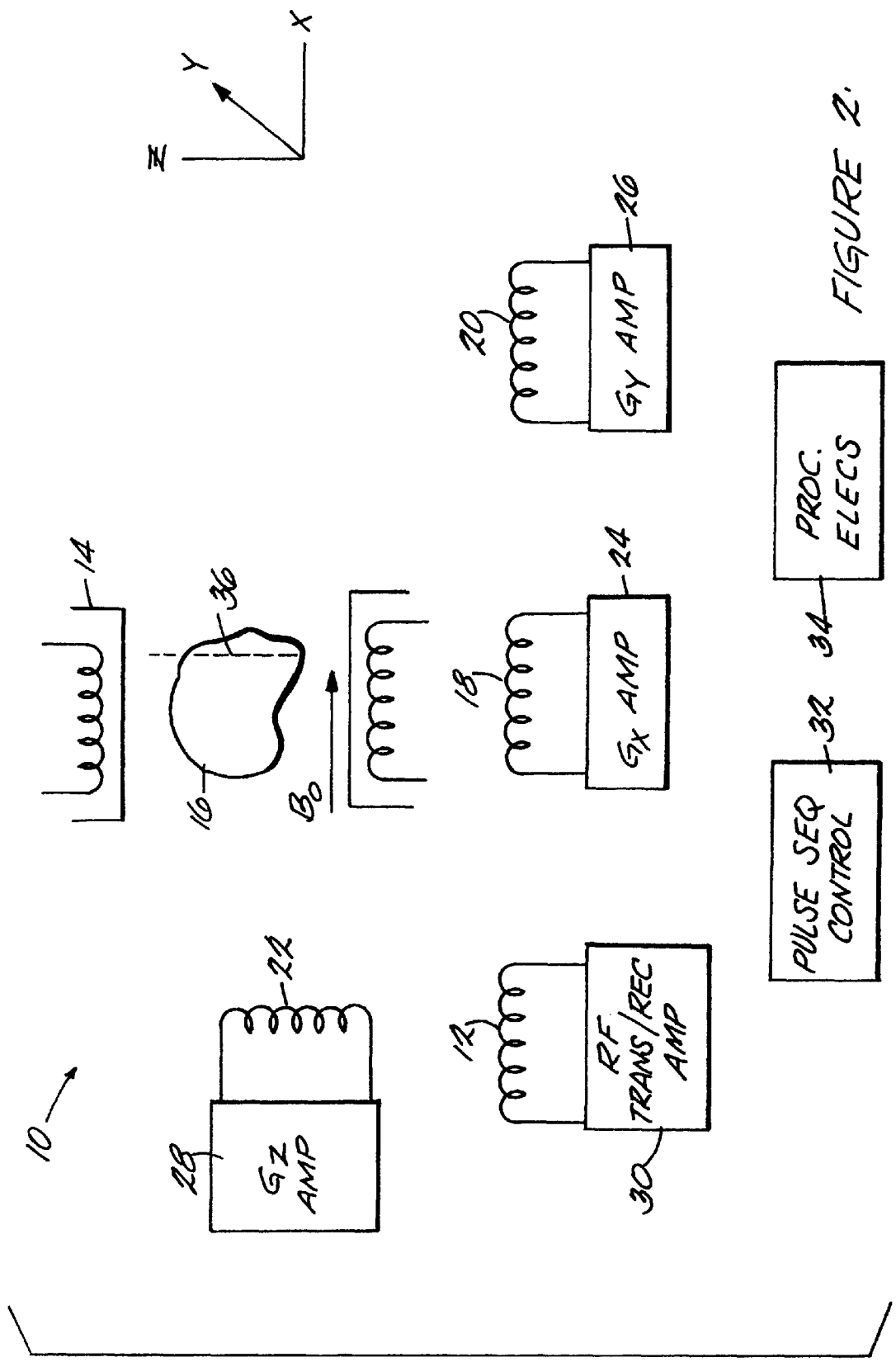
FIG. 2 is a schematic diagram showing basic components of an MR system for use in implementing an embodiment of the invention.

Referring to FIG. 2, there are shown the basic components of an MR system 10 which may be operated to acquire MR data, in accordance with the invention as described herein. System 10, in addition to an RF coil 12, includes a magnet 14 for generating a main or static magnetic field $B_0$, in the bore of a cylindrical magnet containing a patient or other imaging subject 16. System 10 further includes gradient coils 18, 20 and 22 for generating $G_x$, $G_y$ and $G_z$, magnetic field gradients relative to the orthogonal X-,Y- and Z-reference axes, respectively. FIG. 2 shows each of the gradient coils 18, 20 and 22 respectively driven by amplifiers 24, 26 and 28, and RF coil 12 is coupled to transmit/receive amplifier 30. Referring further to FIG. 2, there is shown system 10 provided with a pulse sequence control 32, which is operated to control the RF and gradient amplifiers, and to thereby generate pulse sequences, such as those described herein, to produce and acquire sets of MR image data. System 10 also includes computation and processing electronics 34, for constructing images from acquired MR data, such as an image of the patient 16, taken in an imaging plane 36.

The construction, functions, and interrelationships of the respective components of MR System 10 described above are well known and described in the prior art in full detail, such as in U.S. Pat. No. 5,672,969, issued on Sep. 30, 1997 to Zhou et al.

As stated above in connection with Equation (2), the effect of off resonance in MR imaging can be represented as an additional phase term $\Delta\omega t$. As further stated, the time t is equal to $t_{te}+\Delta t_{kx}+\Delta t_{xy}$, where $\Delta t_{kx}=k_x/\gamma G_x$ and $\Delta t_{ky}=0$. Substituting such relationships into Equation (2) provides the following expression:

$$S(t) = \int_x\int_y m(x, y)e^{-i\left(k_xx+k_yy+\Delta\omega\left(t_{TE}+\frac{k_x}{\gamma G_x}\right)\right)}dx\,dy \qquad \text{Eqn. (3)}$$

Equation (3) can be rearranged to group the $k_x$ terms together to give:

$$S(t) = \int_x\int_y m(x, y)e^{-i\left(k_x\left(x+\frac{\Delta\omega}{\gamma G_x}\right)+k_yy+\Delta\omega t_{TE}\right)}dx\,dy \qquad \text{Eqn. (4)}$$

From Equation (4), it is seen that Fourier transformation of S(t), to reconstruct an image, shifts signals in the x direction to a new location x', where $x'=x+\Delta\omega/\gamma G_x$, as likewise stated above. However, since the spatial encoding is time independent in the phase encoding direction i.e., $\Delta t_{ky}=0$, an off resonance condition does not result in spatial shift in the y direction.

In accordance with the invention, it has been recognized that certain significant benefits, described hereinafter in further detail, can be realized by removing the above time-asymmetry in the k-space data. This may be achieved by introducing the same linear time dependence into the phase encoding direction that is observed in the readout direction. Accordingly, sensitivity to off-resonance will be the same in both directions, and the same spatial shifts resulting from off resonance will be observed therein. That is, if the time dependence in k-space can be made the same in both the readout and phase encoding directions (e.g., in both the x and y directions), the resulting spatial shifts should be symmetric as well.

This result is usefully achieved by modifying the pulse sequence to add a view-dependent time shift such that $\Delta t_{ky}=k_y/\gamma G_x$. Taking into account this added time dependence, Equation (2) (the signal equation), can be rewritten as follows:

$$S(t) = \int_x \int_y m(x, y) e^{-i\left(k_x x + k_y y + \Delta\omega\left(t_{TE} + \frac{k_x}{\gamma G_x} + \frac{k_y}{\gamma G_x}\right)\right)} dx \, dy \qquad \text{Eqn. (5)}$$

Equation (5) may be rearranged to show the $\Delta\omega$ dependence in both x and y directions as follows:

$$S(t) = \int_x \int_y m(x, y) e^{-i\left(k_x\left(x + \frac{\Delta\omega}{\gamma G_x}\right) + k_y\left(y + \frac{\Delta\omega}{\gamma G_x}\right) + \Delta\omega t_{TE}\right)} dx \, dy \qquad \text{Eqn. (6)}$$

From Equation (6), the reconstructed signal locations in the y-direction are seen to be $y'=y+\Delta\omega/\gamma G_x$, where $G_x$ is the readout gradient amplitude. Thus, in reconstructing an image from Equation (6), signal from the position (x, y) is distorted by the same degree along both the X- and Y-axes, as it is shifted to (x', y').

Figure 3:
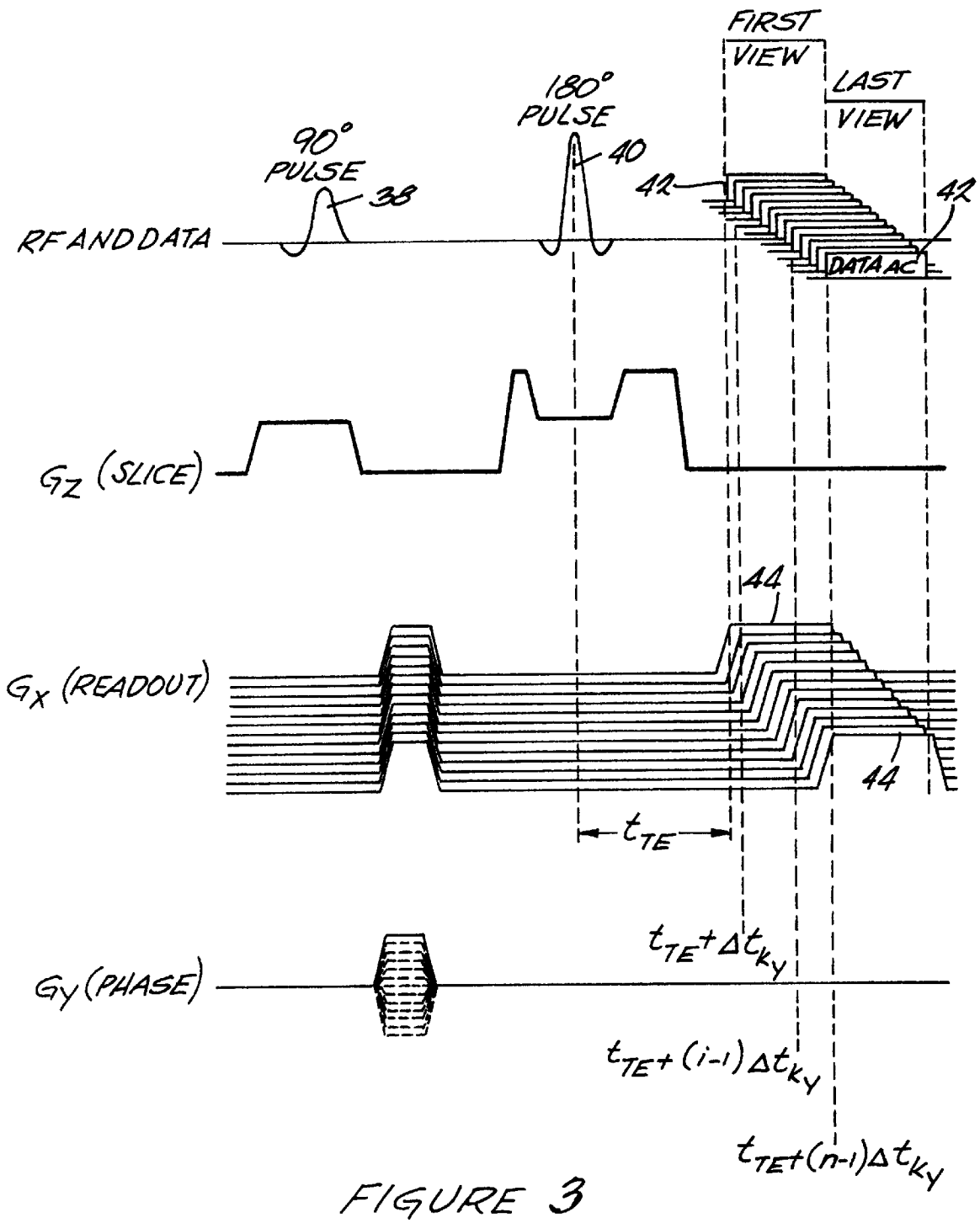
FIG. 3 is a pulse sequence diagram showing an embodiment of the invention.

Referring to FIG. 3, there is shown a spin echo pulse sequence provided with a 90° RF excitation pulse 38, an RF refocusing pulse 40, and a slice select gradient $G_z$. FIG. 3 further shows a readout gradient axis $G_x$, a phase encoding gradient axis $G_y$, and a data acquisition window 42. Window 42 represents the time period during which an MR data signal, produced by RF excitation pulse 38, is refocused by RF pulse 40 to form an echo. The echo is sampled during the acquisition window to provide a set of data points comprising a view.

In the sequence of FIG. 3 the readout axis has the conventional time dependence, as described above, which is determined by the readout gradient $G_x$, and the data window. However, the phase encoding axis ($G_y$), in departure from the prior art, is also provided with a time dependence, which is determined by a view-to-view time shift introduced into both the readout gradient and the data window. To implement the time shift, a first view is acquired by commencing data acquisition window 42, and a readout gradient pulse 44 coincident therewith, at a time $t_{TE}$, following refocusing pulse 40. For the next view, window 42 and readout gradient pulse 44 are shifted by a time $\Delta t_{ky}$. If the window 42 and readout gradient 44 are shifted by equal time increments $\Delta t_{ky}$ for successive views, they will commence at a time $t_{TE}+(i-1)\Delta t_{ky}$ to acquire the ith view, and at a time $t_{TE+(n-1)}\Delta t_{ky}$ to acquire the last of n views. The commencement time of each view determines its position in k-space, along the $k_y$-axis. In order to provide a time dependence in the phase encoding direction which is symmetrical to time dependence in the readout direction, $\Delta t_{ky}$ is selected such that $\Delta t_{ky}=k_y/\gamma G_x$, as described above. By providing time dependence in the phase encoding direction of the k-space data, such direction becomes similar to the readout direction in its sensitivity to off-resonance effects such as chemical shift and magnetic field inhomogeneity.

The $k_y$-dependent echo shifting method described above results in a virtual frequency encoding axis that is a linear combination of the readout and phase encoding axes based on the relative time evolution experienced in these directions. When the time dependence is the same in both axes, or $\Delta t_{kx}=\Delta t_{ky}$, virtual frequency encoding occurs in a diagonal direction, eliminating the in-plane asymmetry between the phase encode and readout directions relative to off-resonance conditions such as chemical shift and $B_0$ inhomogeneity. The time dependence in $k_y$ is based entirely on the view-to-view echo shift illustrated in FIG. 3 and can be arbitrarily set independent of the time evolution in the readout axis. The 45° diagonal case, which makes the phase and frequency axes symmetric with respect to off-resonance conditions, is a special case in which the time dependence is identical for both axes.

Figure 4:
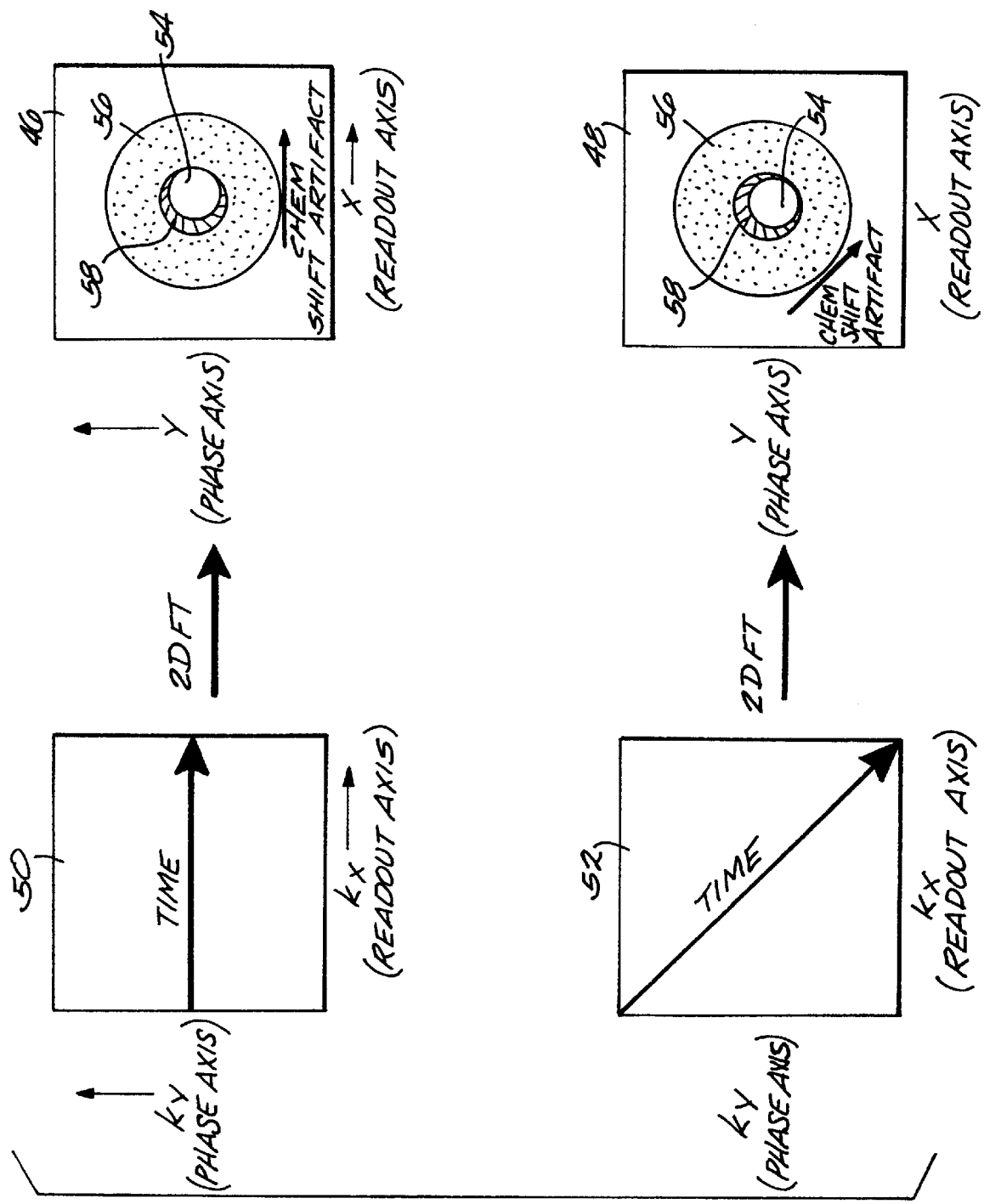
FIG. 4 is a set of diagrams depicting chemical shift displacement artifacts in reconstructed images, wherein linear time evolution in k-space is directed in readout and diagonal directions, respectively.

FIG. 4 provides a comparison of two MR images 46 and 48, reconstructed from k-space data sets 50 and 52, respectively. Data set 50 has a time dependence exclusively in the x direction, whereas data set 52 is provided with a diagonally directed time dependence, in accordance with the technique described above. Data for both images 46 and 48 was acquired from a section taken through a phantom (not shown) comprising a container of fat 54 immersed in a container of water 56. Because of the difference in spectral frequencies between fat and water, chemical shift occurs in both images 46 and 48, producing a displacement artifact 58 along the fat-water interface. However, the position of the artifact is affected by the time dependence of the associated k-space data. Thus, in image 46 artifact 58 is primarily oriented along the left edge of fat region 54, as viewed in FIG. 4. It will be readily apparent that if the readout and phase encoding axes of data set 50 were to be swapped or reversed, so that the time dependence thereof was exclusively in the y direction, artifact 58 would be repositioned to primarily lie along the top edge of fat region 54.

In contrast, in image 48 the artifact 58 is oriented so that significant components thereof are oriented along both the left and top edges of fat region 54. Moreover, the position of artifact 58 in image 48 would be unchanged if the phase encoding and frequency or readout directions of data set 52 were to be swapped, since the direction of time dependence would not change, i.e., it would continue to be diagonally directed. Accordingly, image 48 would not be affected by such swapping of the frequency and phase encoding directions. Previously, MR methods that combine data from swapped frequency and phase encoding directions have been used for improved signal averaging, and also for reduction of motion artifacts. Using conventional 2DFT pulse sequences, both of these methods are sensitive to off resonance conditions such as chemical shift, magnetic susceptibility, and static field inhomogeneity. On the other hand, the method of virtual frequency encoding, in accordance with the embodiment of the invention presented herein, eliminates the off resonance asymmetry, and is readily applicable to such prior art methods. A method for improved signal averaging is described in the art, for example, in an article by Hamilton et al entitled, "Crisscross MR Imaging: Improved Resolution by Averaging Signals with Swapped Phase-Encoding Axes", Radiology 193: 276–279 (1994). A method for reduction of motion artifacts is taught, for example, in an article by Kruger et al entitled, "An orthogonal correlation algorithm for ghost reduction in MRI", Magnetic Resonance in Medicine 38: 678–686 (1997).

Obviously, many modifications and variations of the present invention are possible in light of the above teachings. It is therefore understood that within the scope of the disclosed inventive concept, the invention may be practiced otherwise than as specifically described.

What is claimed is:

1. A method of acquiring MR image data comprising the steps of:

applying a succession of RF excitation pulses to a selected region of an imaging subject to produce a corresponding succession of MR data signals;

generating a readout gradient in association with each of said MR data signals;

acquiring sets of data points from said MR data signals to provide views respectively corresponding thereto, the data points of a view being respectively identified by positions in k-space along a first k-space axis, each of said positions along said first k-space axis having a time offset with respect to a reference;

generating a phase encoding gradient in association with each of said MR signals to respectively identify said views by positions in k-space along a second k-space axis orthogonal to said first k-space axis; and providing specified time offsets with respect to said reference for each of said positions along said second k-space axis, each of said specified time offsets being different.

2. The method of claim 1 wherein the ith positions along said first and second k-space axes are referenced as $k_{iro}$ and $k_{ipe}$, respectively, and wherein:

said $k_{iro}$ and said $k_{ipe}$ positions are respectively provided with time offsets which are equal.

3. The method of claim 2 wherein said readout gradient has an amplitude $G_{ro}$, and wherein:

said $k_{ipe}$ position has a time offset given by $k_{ipe}/\gamma G_{ro}$, and said $k_{iro}$ position has a time offset given by $k_{iro}/\gamma G_{ro}$.

4. The method of claim 1 wherein:

respective data points of a given MR data signal are acquired during a data acquisition window corresponding thereto which commences at a specified time;

the readout gradient associated with said given MR data signal coincides with the data acquisition corresponding thereto; and said step of providing said specified time offsets comprises selectively varying the commencement times of each of said data acquisition windows and of the readout gradients respectively coinciding therewith.

5. The method of claim 4 wherein:

each of said positions along said second k-space axis has the same time offset with respect to said reference as a corresponding position along said first k-space axis.

6. The method of claim 5 wherein said method includes the further steps of:

initially directing said readout and phase encoding gradients along first and second spatial axes, respectively;

acquiring a first set of said views;

reversing the directions of said readout and phase encoding gradients with respect to said first and second spatial axes;

acquiring a second set of said views;

reconstructing first and second images of said selected region from said first and second view sets, respectively; and combining said first and second images to provide a further image of said selected region.

7. A method of acquiring MR image data comprising the steps of:

applying a succession of RF excitation pulses to a selected region of an imaging subject to produce a corresponding succession of MR data signals;

generating a readout gradient in association with each of said MR data signals;

acquiring sets of data points from said MR data signals to provide views respectively corresponding thereto, the data points of a view being respectively identified by positions in k-space along a first k-space axis, each of said positions along said first k-space axis having a time offset with respect to a reference;

generating a phase encoding gradient in association with each of said MR signals to respectively identify said views by positions in k-space along a second k-space axis orthogonal to said first k-space axis; and providing specified time offsets with respect to said reference for each of said positions along said second k-space axis, at least some of said specified time offsets being different.

8. The method of claim 7 wherein the ith positions along said first and second k-space axes are referenced as $k_{iro}$ and $k_{ipe}$, respectively, and wherein:

said $k_{iro}$ and said $k_{ipe}$ positions are respectively provided with time offsets which are equal.

9. The method of claim 8 wherein said readout gradient has an amplitude $G_{ro}$, and wherein:

said $k_{ipe}$ position has a time offset given by $k_{ipe}/\gamma G_{ro}$, and said $k_{iro}$ position has a time offset given by $k_{iro}/\gamma G_{ro}$.

10. The method of claim 7 wherein:

respective data points of a given MR data signal are acquired during a data acquisition window corresponding thereto which commences at a specified time;

the readout gradient associated with said given MR data signal coincides with the data acquisition corresponding thereto; and said step of providing said specified time offsets comprises selectively varying the commencement times of each of said data acquisition windows and of the readout gradients respectively coinciding therewith.

* * * * *